(12) United States Patent
Wang et al.

(10) Patent No.: US 11,113,622 B2
(45) Date of Patent: Sep. 7, 2021

(54) PHONONIC QUANTUM NETWORKS OF SOLID-STATE SPINS WITH ALTERNATING AND FREQUENCY-SELECTIVE WAVEGUIDES

(71) Applicant: University of Oregon, Eugene, OR (US)

(72) Inventors: Hailin Wang, Eugene, OR (US); Mark C. Kuzyk, Eugene, OR (US)

(73) Assignee: University of Oregon, Eugene, OR (US)

( * ) Notice: Subject to any disclaimer, the term of this patent is extended or adjusted under 35 U.S.C. 154(b) by 178 days.

(21) Appl. No.: 16/293,555

(22) Filed: Mar. 5, 2019

(65) Prior Publication Data

US 2020/0327437 A1 Oct. 15, 2020

Related U.S. Application Data

(60) Provisional application No. 62/642,543, filed on Mar. 13, 2018.

(51) Int. Cl.
*G06N 10/00* (2019.01)
*G10K 11/04* (2006.01)
*B81B 3/00* (2006.01)

(52) U.S. Cl.
CPC ........... *G06N 10/00* (2019.01); *B81B 3/0021* (2013.01); *B81B 3/0029* (2013.01); *G10K 11/04* (2013.01)

(58) Field of Classification Search
CPC .... G06N 10/00; B81B 3/0021; B81B 3/0029; G10K 11/04

USPC .......................................................... 333/186
See application file for complete search history.

(56) References Cited

U.S. PATENT DOCUMENTS

| | | | |
|---|---|---|---|
| 9,059,388 B2* | 6/2015 | Tahan | H01L 49/006 |
| 9,928,827 B1* | 3/2018 | El-Kady | G10K 11/18 |
| 2018/0090200 A1* | 3/2018 | Soykal | G11C 11/42 |
| 2019/0270635 A1* | 9/2019 | Painter | G11C 13/025 |

OTHER PUBLICATIONS

Golter et al., "Coupling a Surface Acoustic Wave to an Electron Spin in Diamond via a Dark State," available at: http://arxiv.org/pdf/1608.01356v1, pp. 1-24 (Aug. 3, 2016).

Golter et al., "Coupling a Surface Acoustic Wave to an Electron Spin in Diamond via a Dark State," *Physical Review X*, 6:041060-01-041060-11 (2016).

Kepesidis et al., "Phonon cooling and lasing with nitrogen-vacancy centers in diamond," *Physical Review B*, 88:064105-1-064105-12 (2013).

(Continued)

*Primary Examiner* — Hafizur Rahman
(74) *Attorney, Agent, or Firm* — Klarquist Sparkman, LLP

(57) ABSTRACT

Spin qubits are situated in mechanical resonators that are acoustically coupled with acoustic waveguides. The acoustic waveguides provide frequency dependent phonon propagation selected so that mechanical resonators adjacent to a selected mechanical resonator are acoustically coupled to the selected mechanical resonator in different acoustic frequency ranges. This configure permits directional transfer of quantum states between spins in spin-mechanical resonator and provides a scalable platform for spin-based quantum computing.

27 Claims, 16 Drawing Sheets

(56) References Cited

OTHER PUBLICATIONS

Kuzyk, "Abstract: Directional phononic network of spin-mechanical resonators," Bulletin of the American Physical Society, APS Mar. Meeting 2018, 1 page (Mar. 5-9, 2018).
Kuzyk, "Multimode Optomechanical Systems and Phononic Networks," Dissertation, 191 pages (Sep. 2018).
Kuzyk et al., "Phononic Quantum Networks of Solid-State Spins with Alternating and Frequency-Selective Waveguides," available at: http://arxiv.org/pdf/1804.07862v1, pp. 1-29 (Apr. 20, 2018).
Kuzyk et al., "Scaling Phononic Quantum Networks of Solid-State Spins with Closed Mechanical Subsystems," available at: http://arxiv.org/pdf/1804.07862v2, pp. 1-34 (Nov. 6, 2018).
Kuzyk et al., "Scaling Phononic Quantum Networks of Solid-State Spins with Closed Mechanical Subsystems," *Physical Review X*, 8:041027-1-041027-14 (2018).
Lemonde et al., "Phonon networks with SiV centers in diamond waveguides," available at: http://arxiv.org/pdf/1801.01904v1, pp. 1-7 (Jan. 5, 2018).
Lemonde et al., "Supplemental material: Phonon networks with SiV centers in diamond waveguides," available at: http://arxiv.org/pdf/1801.01904v1, pp. 1-15 (Jan. 5, 2018).
Li et al., "Honeycomb Phononic Networks with Closed Mechanical Subsystems," available at: http://arxiv.org/pdf/1901.00561v1, pp. 1-19 (Jan. 3, 2019).
Wang, "Abstract: Quantum Spin-Mechanics with Color Centers in Diamond," Verhandlungen der Deutschen Physikalischen Gesellschaft, Berlin 2018—wissenschaftliches Programm, 2 pages (Mar. 15, 2018).
Albrecht et al., "Coupling of Nitrogen Vacancy Centres in Nanodiamonds by Means of Phonons," *New Journal of Physics*, vol. 15, 26 pages (Aug. 6, 2013).
Bhaskar et al., "Quantum Nonlinear Optics with a Germanium-Vacancy Color Center in a Nanoscale Diamond Waveguide," *Physical Review Letters*, 118:223603-1-223603-6 (Jun. 2, 2017).
Burek, et al., "Diamond Optomechanical Crystals," *Optica*, 3(12):1404-1411 (Sep. 6, 2016).
Chen et al., "Entangling separate nitrogen-vacancy centers in a scalable fashion via coupling to microtoroidal resonators," *Physical Review A*, 83(5):054305-1-054305-4 (May 23, 2011).
Doherty et al., "The nitrogen-vacancy colour centre in diamond," *Phys. Rep.*, https://www.arxiv-vanity.com/papers/1302.3288/, 105 pages (Feb. 14, 2013).
Golter et al., "Optomechanical Quantum Control of a Nitrogen-Vacancy Center in Diamond," *Physical Review Letters*, 116:143602-1-143602-6 (Apr. 2016).
Habraken et al., "Continuous Mode Cooling and Phonon Routers for Phononic Quantum Networks," *New Journal of Physics*, vol. 14, 32 pages (Nov. 5, 2012).
Kepesidis et al., "Phonon Cooling and Lasing with Nitrogen-Vacancy Centers in Diamond," *Physical Review B*, 88:064105-1-064105-12 (Aug. 27, 2013).
Kuzyk et al., "Scaling Phononic Quantum Networks of Solid-State Spins with Closed Mechanical Subsystems," *Physical Review X*, 8:041027-01-041027-14 (Nov. 13, 2018).
MacQuarrie et al, "Cooling a Mechanical Resonator with Nitrogen-Vacancy Centres Using a Room Temperature Excited State Spin-Strain Interaction," arXiv:1605.07131v2, 28 pages (Jun. 23, 2016).
MacQuarrie et al, "Mechanical Spin Control of Nitrogen-Vacancy Centers in Diamond," *Physical Review Letters*, 111, 5 pages (Nov. 27, 2013).
Meenehan et al., "Pulsed excitation dynamics of an optomechanical crystal resonator near its quantum ground-state of motion," arXiv:1503.05135v1, 16 pages (Mar. 17, 2015).
Meesala et al., "Enhanced Strain Coupling of Nitrogen-Vacancy Spins to Nanoscale Diamond Cantilevers," *Physical Review Applied*, 5:034010-1-034010-8 (Mar. 18, 2016).
Meesala et al., "Strain Engineering of the Silicon-Vacancy Center in Diamond," *Physical Review B*, vol. 97, 14 pages (May 29, 2018).
Painter et al., U.S. Appl. No. 62/638,817 for "Integrated Acoustic . . . ," 4 pages, filed Mar. 5, 2018.
Painter et al., U.S. Appl. No. 62/638,829 for "Silicon-on-Insulator-based . . . ," 4 pages, filed Mar. 5, 2018.
Painter et al., U.S. Appl. No. 62/652,194 for "Ultra-Coherent Thin-Film Microwave Acoustic Bandgap Quantum Phonon Memory," 5 pages, filed Apr. 3, 2018.
Painter et al., U.S. Appl. No. 62/652,197 for "Reconfigurable microwave filters using mechanically induced transparency," 12 pages, filed Apr. 3, 2018.
Painter et al., U.S. Appl. No. 62/652,200 for "Electro-Opto-Mechanical Crystals: parametric metasurfaces for classical signal processing and thermal management," 8 pages, filed Apr. 3, 2018.
Rabl et al., "A quantum spin transducer based on nanoelectromechanical resonator arrays," *Nature Physics*, 6:602-608 (Aug. 2010).
Safavi-Naeini et al., "Proposal for an Optomechanical Traveling Wave Phonon-Photon Translator," *New Journal of Physics*, 13(013017):1-30 (Jan. 13, 2011).
Schuetz et al., "Universal Quantum Transducers Based on Surface Acoustic Waves," *Physical Review X*, 5:031031-01-031031-30 (Sep. 10, 2015).
Sipahigil et al., "Indistinguishable Photons from Separated Silicon-Vacancy Centers in Diamond," *Physical Review Letters*, 113:113602-1-113602-5 (Sep. 12, 2014).
Siyushev et al., "Optical and microwave control of germanium-vacancy center spins in diamond," *Physical Review B*, 96:081201-1-081201-5 (Aug. 18, 2017).
Stannigel et al., "Optomechanical Transducers for Long-Distance Quantum Communication," *Physical Review Letters*, 105:220501-1-220501-4 (Nov. 26, 2010).
Teissier et al., "Strain Coupling of a Nitrogen-Vacancy Center Spin to a Diamond Mechanical Oscillator," arXiv:1403.3405v1, 8 pages (Mar. 13, 2014).
Xiang, "Intracity Quantum Communication via Thermal Microwave Networks" *Physical Review X*, 7:011035-1-011035-11 (Mar. 27, 2017).

\* cited by examiner

FIG. 1B
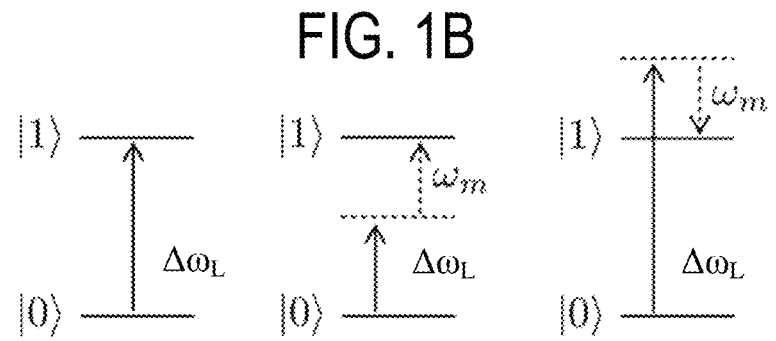
FIG. 1A    FIG. 1C
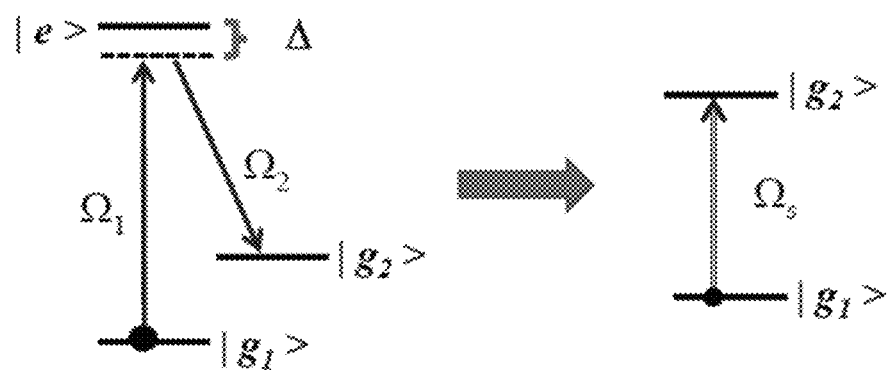
FIG. 1D
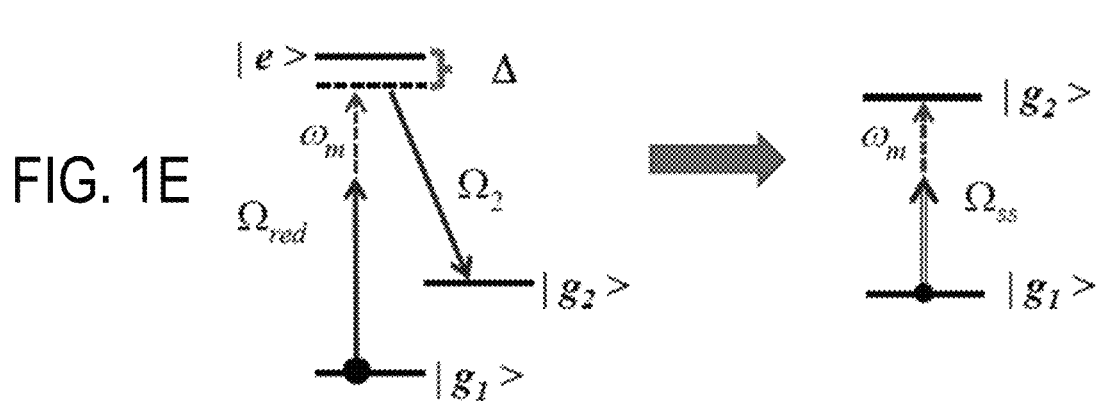
FIG. 1E

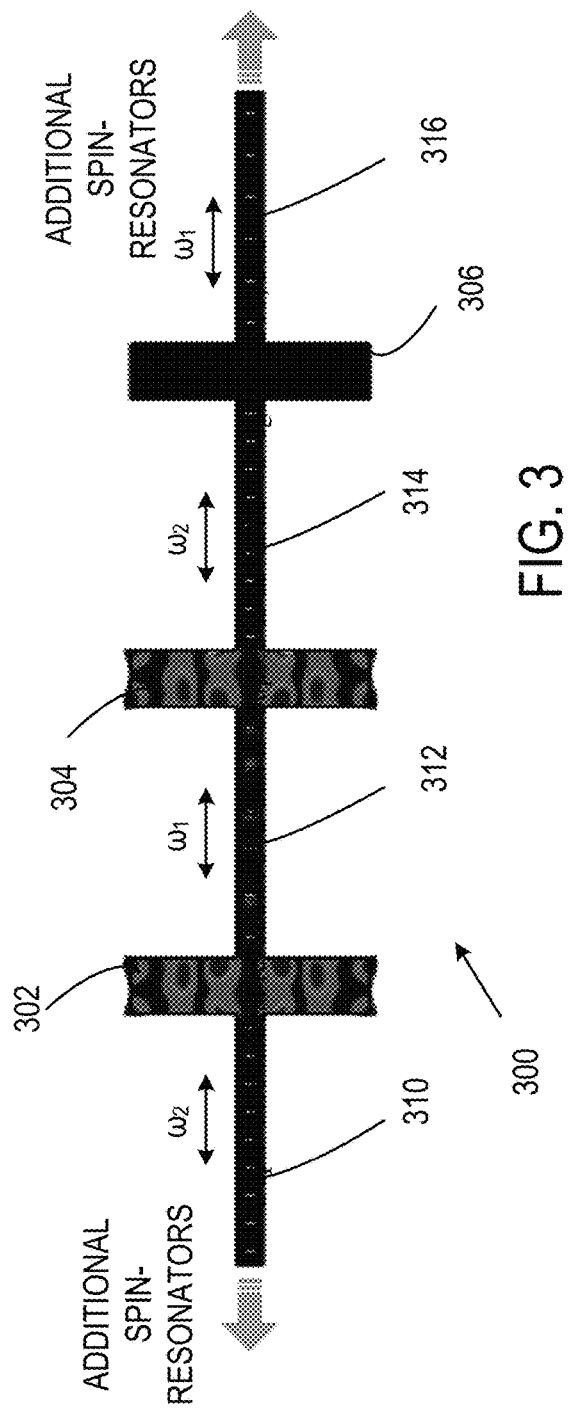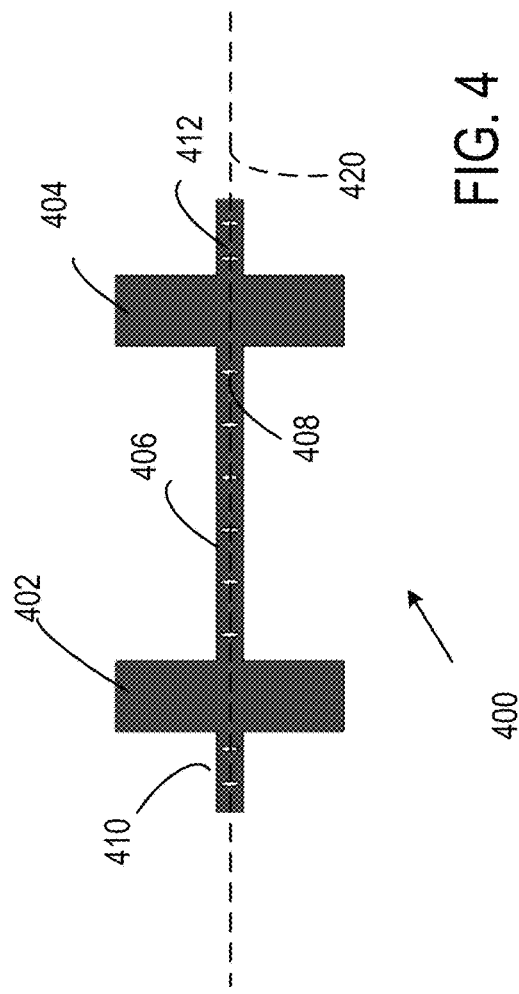

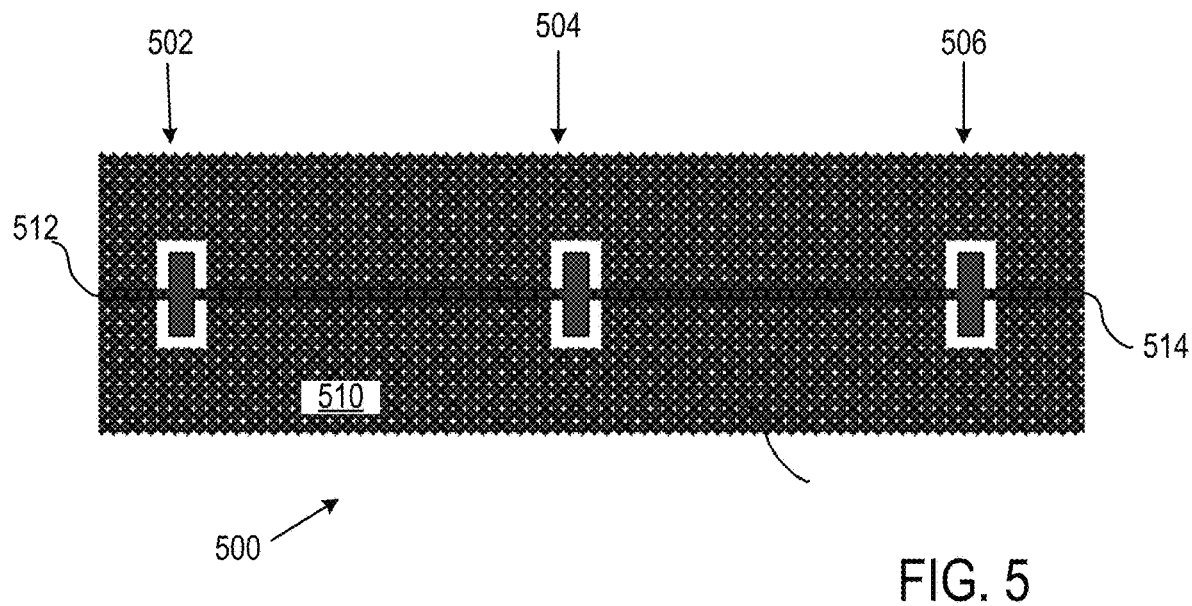
FIG. 5
FIG. 6
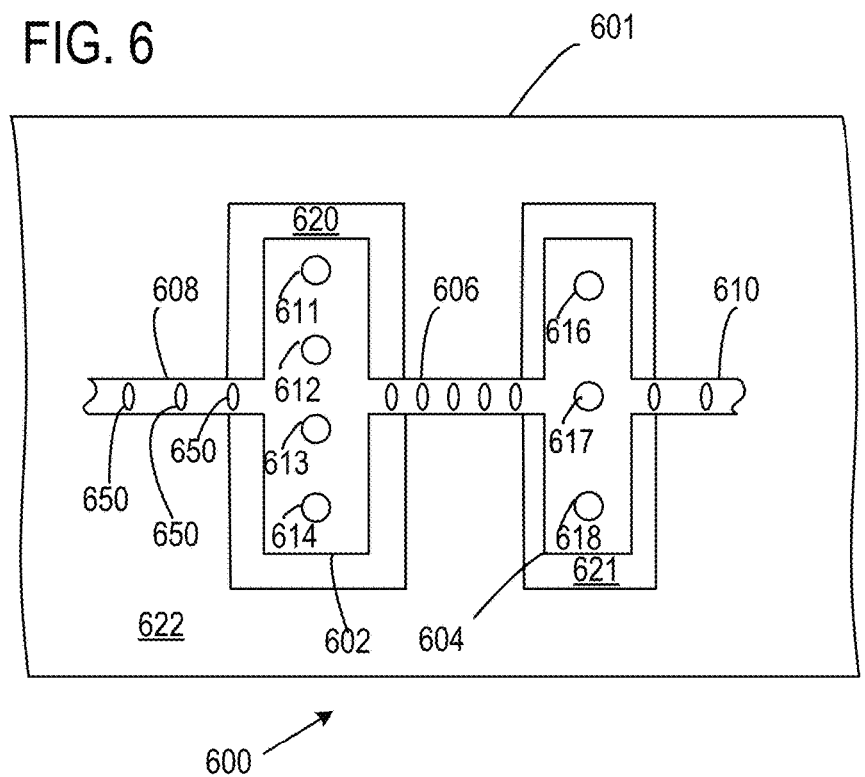

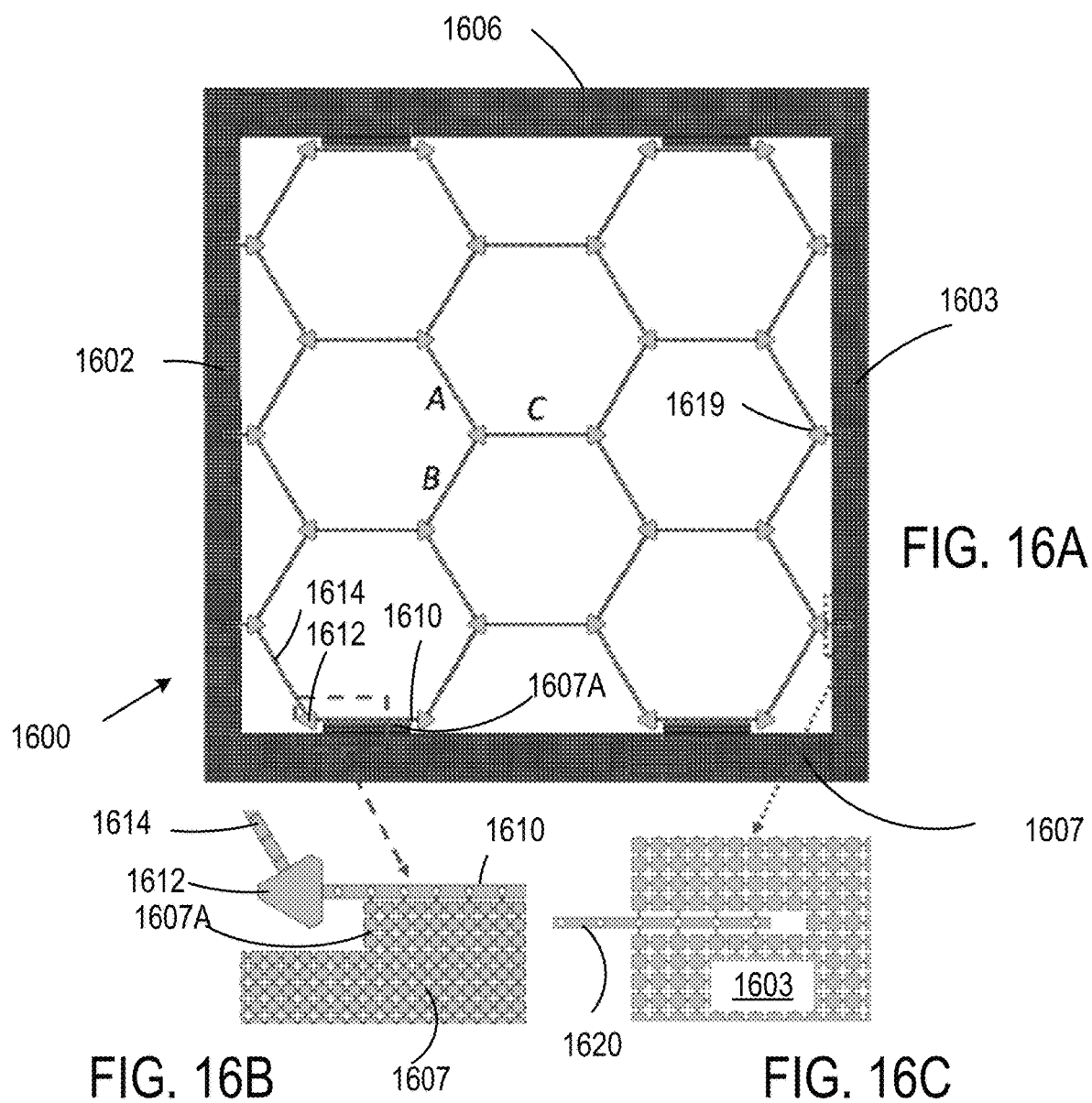

PHONONIC QUANTUM NETWORKS OF SOLID-STATE SPINS WITH ALTERNATING AND FREQUENCY-SELECTIVE WAVEGUIDES

CROSS REFERENCE TO RELATED APPLICATION

This application claims the benefit of U.S. Provisional Application No. 62/642,543, filed Mar. 13, 2018, which is hereby incorporated by reference in its entirety.

ACKNOWLEDGEMENT OF GOVERNMENT SUPPORT

This invention was made with government support under contracts 1606227 and 1641084 awarded by the National Science Foundation and contract FA9550-16-1-0424 awarded by the Air Force Office of Scientific Research. The government has certain rights in the invention.

FIELD

The disclosure pertains to phononic waveguides that permit directional transfer of quantum states between qubits.

SUMMARY

Quantum circuits comprise at least a first spin qubit situated on a first mechanical resonator and a first acoustic waveguide coupled to the first mechanical resonator in a first acoustic frequency range. In some examples, a second acoustic waveguide is coupled to the first mechanical resonator in a second frequency range that is different from the first frequency range. In other examples, the first mechanical resonator, the first acoustic waveguide, and the second acoustic waveguide are defined in a diamond membrane. In a specific example, the first mechanical resonator is defined by a rectangular portion of the diamond membrane, and the first frequency range and the second frequency range are defined by a first set of holes in the first acoustic waveguide and a second set of holes in the second acoustic waveguide, wherein a first period associated with the first set of holes and a second period associated with the second set of holes are different. The first acoustic waveguide can be coupled to the first mechanical resonator at a first side of a central portion of the first mechanical resonator, and the second acoustic waveguide can be coupled to the first mechanical resonator at a second side of the central portion of the first mechanical resonator. In a representative embodiment, the first acoustic waveguide and the second acoustic waveguide extend along a common axis that is perpendicular to the first side and second side of the first mechanical resonator, and the first set of holes and the second set of holes are periodic along the common axis.

In typical examples, the first acoustic waveguide and the second acoustic waveguide define a first bandgap and a second bandgap, respectively, wherein the first frequency range and the second frequency range correspond to non-overlapping portions of the first bandgap and the second bandgap. In some embodiments, devices are formed on a diamond membrane having a thickness between 100 nm and 1 μm. At least the first spin qubit can be situated at an acoustic node of the first mechanical resonator. In additional examples, a second mechanical resonator is coupled to the first mechanical resonator by the first acoustic waveguide in the first frequency range at a first side of a central portion of the second mechanical resonator. A second spin qubit is situated on the second mechanical resonator, wherein the first acoustic waveguide and at least the first spin qubit are coupled to the second mechanical resonator and the second spin qubit in the first acoustic frequency range. In some examples, the second mechanical resonator is defined by a rectangular portion of the diamond membrane and the holes of at least the first set of holes or the second set of holes are elliptical having minor axes extending along the common axis of the first acoustic waveguide and the second acoustic waveguide.

In representative embodiments, the first and second spin qubits are defined by respective nitrogen-vacancy (NV), germanium-vacancy (GeV), or silicon-vacancy (SiV) centers in a diamond membrane, and the first and second mechanical resonators are defined by respective portions of the diamond membrane. The first acoustic waveguide is defined in a portion of the diamond membrane and includes a periodic variation in acoustic impedance so as to attenuate acoustic propagation between the first and second mechanical resonators at an acoustic frequency associated with a period of the periodic variation. In some examples, a third mechanical resonator is coupled to the first mechanical resonator by the second acoustic waveguide and at least a third spin qubit situated on the third mechanical resonator. Typically, at least one of the first acoustic waveguide and the second acoustic waveguide includes a plurality of periodically situated thinned areas or apertures that define an associated frequency range or that define respective bandgaps that are partially overlapping and the first acoustic frequency range and the second acoustic frequency range are associated with nonoverlapping portions of the respective bandgaps.

Quantum circuits comprise a plurality of spin-mechanical resonators (SMRs) and a plurality of acoustic waveguides coupled to the SMRs so that each SMR is coupled to a first other SMR in a first frequency band and a second other SMR in a second frequency band that is different than the first frequency band. A phononic crystal is situated about the SMRs, wherein a bandgap of the phononic crystal includes frequencies of the first frequency band and the second frequency band. In some examples, the SMRs are arranged in a linear array or a two dimensional array. In a specific example, the SMRs are arranged in a two dimensional array, and SMRs of a first row are alternately coupled at first and second different frequencies by associated acoustic waveguides of the plurality of acoustic waveguides to adjacent SMRs of the first row. Adjacent SMRs of a second row that is adjacent the first row are alternately coupled at the first and second different frequencies by associated acoustic waveguides of the plurality of acoustic waveguides to adjacent SMRs of the second row. Column-wise adjacent SMRs of the first row and the second row are coupled by associated acoustic waveguides at a third frequency that is different from the first frequency and the second frequency.

Methods comprise selecting a first spin qubit situated on first spin-mechanical resonator (SMR) and a second spin qubit situated a second SMR and providing acoustic coupling between the first SMR and the second SMR in a first acoustic frequency range. A phonon is produced at a resonance frequency of the mechanical resonator of the second SMR and that is in the first acoustic frequency range. The phonon is coupled to the second SMR so that a quantum state of the second spin qubit of the second SMR changes based on a quantum state of the first spin qubit of the first SMR. In some examples, the phonon is produced at a difference frequency associated with frequency components of an optical beam or in response to an applied microwave signal. In some embodiments, the first SMR and the second SMR are acoustically coupled to a third SMR and a fourth SMR, respectively, in a second acoustic frequency range that is different from the first acoustic frequency range. In other examples, the first spin qubit of the first SMR and a second spin qubit of the first SMR are selected, and acoustic coupling between the first spin qubit of the first SMR and the second spin qubit of the first SMR is provided in an intra-SMR acoustic frequency range in which the first SMR and the second SMR are uncoupled. An intra-SMR phonon in the intra-SMR frequency range is coupled to the second spin qubit of the first SMR so that a quantum state of the second spin qubit of the first SMR changes. In additional examples, the first qubit of the first SMR is coupled to an ensemble of spin qubits on the first SMR and a state of the first spin qubit of the first SMR is transferred to the second spin qubit on the second SMR in response to the phonon.

These and other features and aspects of the disclosure are set forth in detail below with reference to the accompanying drawings.

BRIEF DESCRIPTION OF THE DRAWINGS

FIGS. 1A-1C are simplified energy level diagrams for a representative qubit.

FIGS. 1D-1E illustrate energy transitions such as depicted in FIGS. 1A-1C using an intermediate state or set of states.

FIG. 3 illustrates SMRs coupled by acoustic waveguides that provide coupling at selected acoustic frequencies.

FIG. 4 illustrates two SMRs coupled by acoustic waveguides that provide coupling at selected acoustic frequencies.

FIG. 5 illustrates SMRs defined in a diamond membrane along with a phononic crystal.

FIG. 6 illustrates a quantum computing substrate that includes two SMRs.

FIGS. 16A-16C illustrate an SMR arrangement similar to that of FIG. 15C surrounded by a phononic crystal.

DETAILED DESCRIPTION

Figure 2A:
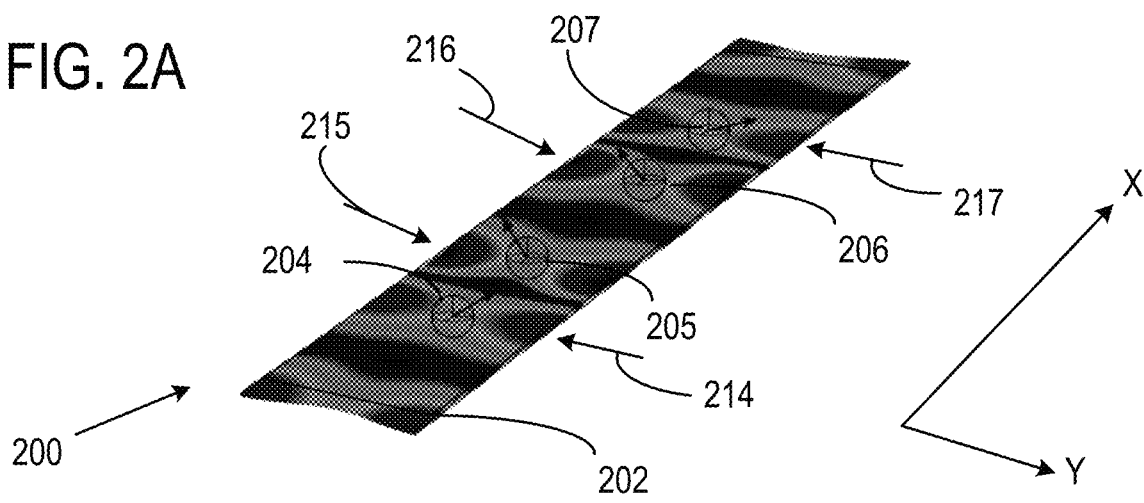
FIG. 2A illustrates a representative spin-mechanical resonator (SMR) having four spin centers.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

Examples are described with reference to directions indicated as "above," "below," "upper," "lower," and the like. These terms are used for convenient description, but do not imply any particular spatial orientation.

The disclosure pertains to phononic waveguides that are situated to provide directional transfer of quantum states between spins in separate spin-mechanical resonators (SMRs) as well as permit internal transfer within SMRs. Quantum state transfer can be made immune to thermal mechanical noise in the phononic waveguides. Interconnection of such spin-mechanical waveguides can provide scalable spin-based quantum computers.

As used herein, a spin-mechanical resonator includes a spin-based qubit having quantum states associated with spin and a mechanical structure having associated mechanical resonances. In the disclosed examples, spin qubits are implemented as nitrogen-vacancy (NV) centers in diamond. Such NV centers are based on a nitrogen substitution for a carbon along with an adjacent missing carbon. Other quantum systems can be based on silicon or germanium substitutions in diamond, or other systems, and NV diamond is chosen for convenient illustration. NV diamond spin qubits provide a number of quantum states that can be used for quantum computation, and selected to correspond to I0> and I1> states. For NV diamond, two of the three available ground states are convenient. In the disclosed examples, mechanical resonators are formed as rectangular slabs of a diamond membrane, and resonant modes along a longest dimension of the slabs are used for state preparation and coupling, but other geometries can be used. Coupling of spin qubits to mechanical modes is generally superior if spin qubits are situated proximate resonance nodes.

FIGS. 1A-1C illustrate state transitions associated with NV spin qubits that can be used for state preparation and coupling. As shown in FIG. 1A, a photon of angular frequency $\omega_L$ corresponding to an energy difference between I0> and I1> states can produce a I1> state from a I0> state (and vice versa). As shown in FIG. 1B, a photon of angular frequency $\omega_L$ of lesser energy than the energy difference between I0> and I1> states in combination with a phonon of angular frequency $\omega_m$ produces the I0> state to I1> state transition. Both the incident photon and phonon are absorbed. As shown in FIG. 1C, a photon of angular frequency $\omega_L$ of greater energy that the energy difference between I0> and I1> states produces a phonon of angular frequency $\omega_m$ as well as the transition from the I0> state to the I1> state. Note that the transitions from the I1> state to the I0> similarly produce only a photon, produce a photon and a phonon, or produce a photon and use a phonon. Tuning photon wavelength permits selection of which type of transition is made, and establishes phonon energy required for state transition and/or the energy of the emitted phonon.

FIGS. 1D-1E illustrate additional details of the state diagrams of FIGS. 1A-1C. The transitions between states associated with spin qubit states can use an intermediate state for the transition.

Referring to FIG. 2A, a representative spin-mechanical resonator 200 includes a section 202 of a diamond membrane with NV centers 204-207 situated along a longitudinal axis (shown in FIG. 2A as an X-axis). The NV centers 204-207 are situated at respective nodes 214-217 of mechanical resonances of the section 202. In typical examples, the section 202 is rectangular and has a Y-dimension of between 1 µm and 1 mm, typically between about 5 µm and 15 µm and an X-dimension of greater than 5 µm. The thickness of section 202 is typically between about 100 nm and 1 µm, such as about 300 nm. Dimensions are typically selected to provide mechanical resonances at preferred frequencies for directional coupling of SMRs.

Figure 2B:
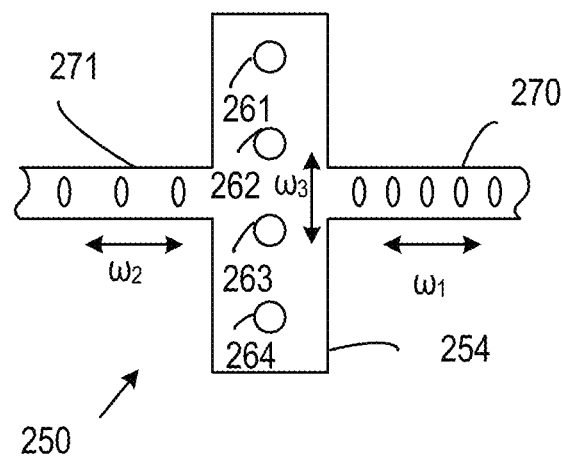
FIG. 2B illustrates a representative spin-mechanical resonator such as that of FIG. 2A along with acoustic waveguides that provide acoustic communication at different frequencies and that do not support acoustic communication at a frequency suitable for acoustic communication within the SMR.

FIG. 2B illustrates an SMR 250 that includes spin qubits 261-264 situated on a mechanical resonator 254 that is acoustically coupled to acoustic waveguides 270, 271 that provide acoustic communication at different angular frequencies $\omega_1$ and $\omega_2$, respectively. In addition, the acoustic waveguides 270, 271 block acoustic communication at the angular frequencies $\omega_2$ and $\omega_1$, respectively. At least one resonance frequency of the mechanical resonator 254 is associated with a third acoustic frequency $\omega_3$ that does not propagate on either of the waveguides 270, 271. This frequency can be used for state transfer or other processes on a single resonator. Typically, SMRs are coupled to two or more acoustic waveguides that permit acoustic coupling at respective acoustic wavelengths such that communication frequencies of each waveguide are at forbidden band frequencies of the other waveguides. At least one acoustic frequency is associated with intra-resonator coupling and this frequency is in the forbidden band (i.e., band gap) of all the acoustic waveguides. Each spin qubit is coupled to acoustic modes at each of these frequencies. An acoustic resonator may permit multiple frequencies to be used, and waveguides can provide directional coupling at a plurality of acoustic frequencies.

FIG. 3 illustrates a quantum computing circuit 300 that includes a spin-mechanical resonator 302 that is coupled to acoustic waveguides 310, 312, a spin-mechanical resonator 304 that is coupled to acoustic waveguides 312, 314, and a spin-mechanical resonator 306 that is coupled to acoustic waveguides 314, 316. Additional spin-mechanical resonators and acoustic waveguides can be included, and the configuration of FIG. 3 is only a convenient example. The acoustic waveguides are selected for acoustic (phonon) coupling at selected frequencies or frequency bands and prevent acoustic coupling at other frequencies or frequency bands. The SMRs 302, 304, 306 are selected to have acoustic resonances at acoustic frequencies to be used for coupling. For example, the acoustic waveguides 312, 314 can permit coupling at acoustic frequencies $\omega_1$ and $\omega_2$ (corresponding to SMR resonance frequencies) so that the SMR 304 can communicate with SMR 302 at acoustic frequency $\omega_1$ and communicate with SMR 306 at acoustic frequency $\omega_2$. The acoustic waveguides 310, 316 can provide acoustic coupling at acoustic frequency $\omega_2$ and acoustic frequency $\omega_1$, respectively. Waveguides can be tuned to additional frequencies if desired, but only two frequencies (or frequency bands) are used in this example. Additional frequencies are used for intra-resonator spin coupling.

FIG. 4 illustrates a quantum computing circuit 400 that includes SMRs 402, 404 coupled by an acoustic waveguide 406. The SMRs 402, 404 are also coupled to respective waveguides 410, 412 and additional SMRs (not shown). The acoustic waveguide 406 is defined by a section of diamond membrane having a plurality of thinned or etched regions such as region 408. Such regions are generally periodically spaced along an axis 420 to select acoustic frequencies or frequency bands at which an acoustic waveguide provides coupling. While it is convenient to define such regions by etching away portions of a diamond membrane that defines the acoustic waveguide, periodic thinned or thickened regions can be used, or additional materials can be situated periodically on a waveguide membrane. Acoustic waveguides are illustrated as linear for convenience, but curved, polygonal, or other shapes can be used, and an axis of such waveguides need not be a single straight line but can be curved or include numerous line segments.

FIG. 5 illustrates a quantum computing substrate 500 that includes SMRs 502, 504, 506 coupled by tuned acoustic waveguides. Additional SMRs can be provided and coupled to acoustic waveguides 512, 514. A phononic crystal structure 510 is situated about the SMRs 502, 504, 506 and is selected to have a band gap so that acoustic frequencies used in coupling between SMRs (as communicated by acoustic waveguides) and within SMRs do not propagate in the phononic crystal structure 510. Each of the SMRs 502, 504, 506 is situated in a keepout area in which a membrane (such as a diamond membrane) in which SMRs and/or acoustic waveguides are defined is removed or substantially thinned.

FIG. 6 illustrates a substrate 600 that includes a diamond membrane 601 on which a phononic crystal 622 is defined. SMRs 602, 604 are coupled by an acoustic waveguide 606 and to additional SMRs via acoustic waveguides 608, 610.

The SMRs 602, 604 include NV centers 611-614 and 616-618 respectively, but fewer or more NVs can be provided. The SMRs 602, 604 can have the same or similar dimensions. The acoustic waveguide 606 permits coupling at an acoustic frequency (or multiple acoustic frequencies) that correspond to resonance frequencies of both SMRs 602, 604. Acoustic waveguide band gap and permitted frequencies are established using one or more sets of hole or other apertures 650, thinned or thickened waveguide portions, or other periodic or multiply periodic variations in acoustic impedance. Each of the SMRs 602, 604 is situated in a respective keepout region 620, 621 to reduce or eliminate unwanted acoustic coupling.

Figure 7:
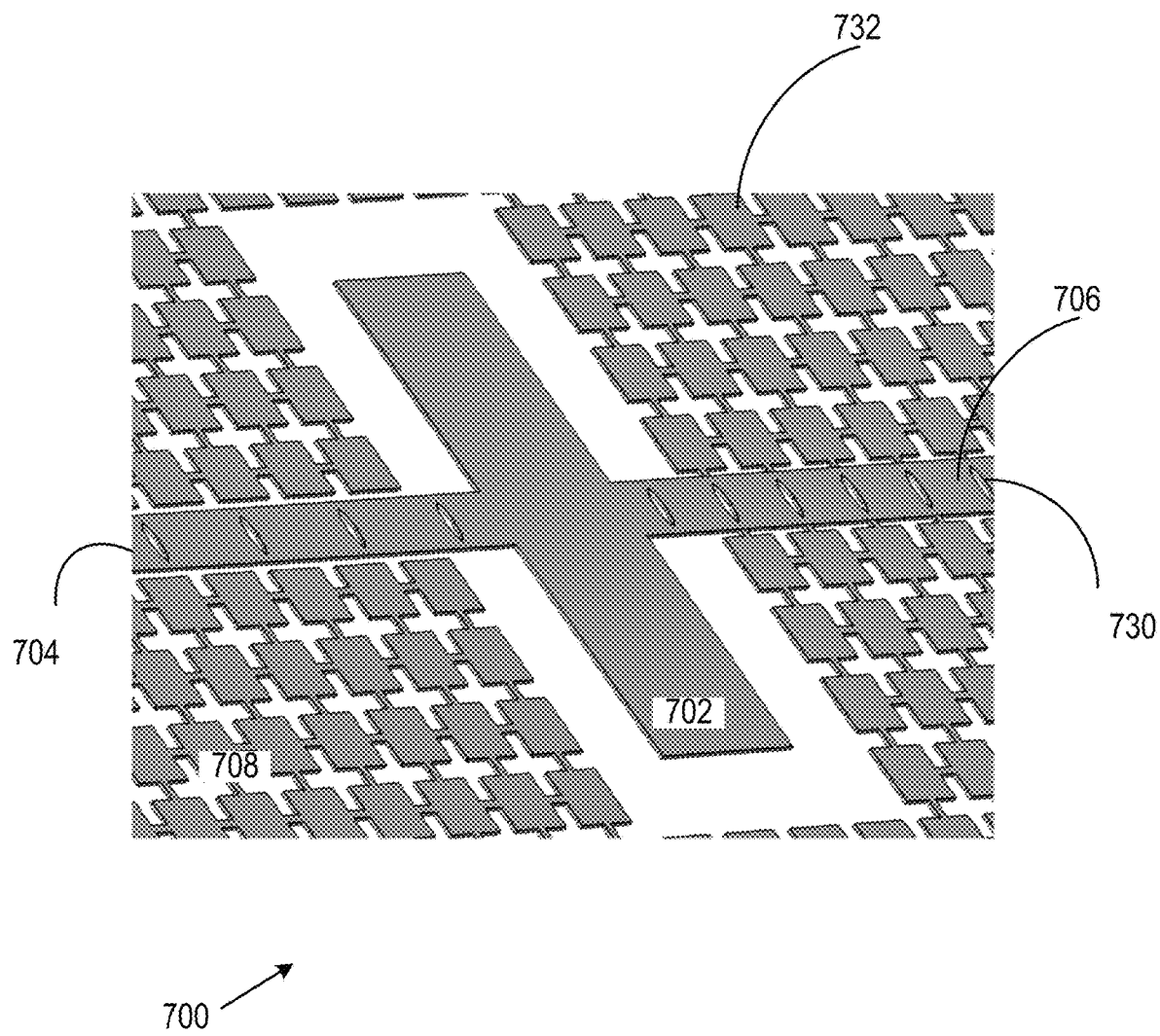
FIG. 7 is a perspective view of a quantum computing substrate.

FIG. 7 is a perspective illustration of a representative substrate 700 that includes a phononic crystal 708 situated about an SMR 702. The SMR 702 is coupled to acoustic waveguides 704, 706, and the acoustic waveguide 706 includes periodic acoustic disturbances (for example, etched away area 730) having a common period with the phononic crystal 708. In this case, portions of the phononic crystal 710 are mechanically coupled to the acoustic waveguide 706, and a supporting membrane connecting the phonic crystal 708 and the acoustic waveguide 706 is not etched away. As shown in FIG. 7, periodic features (such as 732) are coupled to the acoustic waveguide 706 at the acoustic disturbances (i.e., at features such as 730). The acoustic waveguide 704 has periodic acoustic impedance variations but at a period different from that of the phononic crystal 708, and portions of the substrate 700 about the acoustic waveguide 704 are removed.

Figure 8:
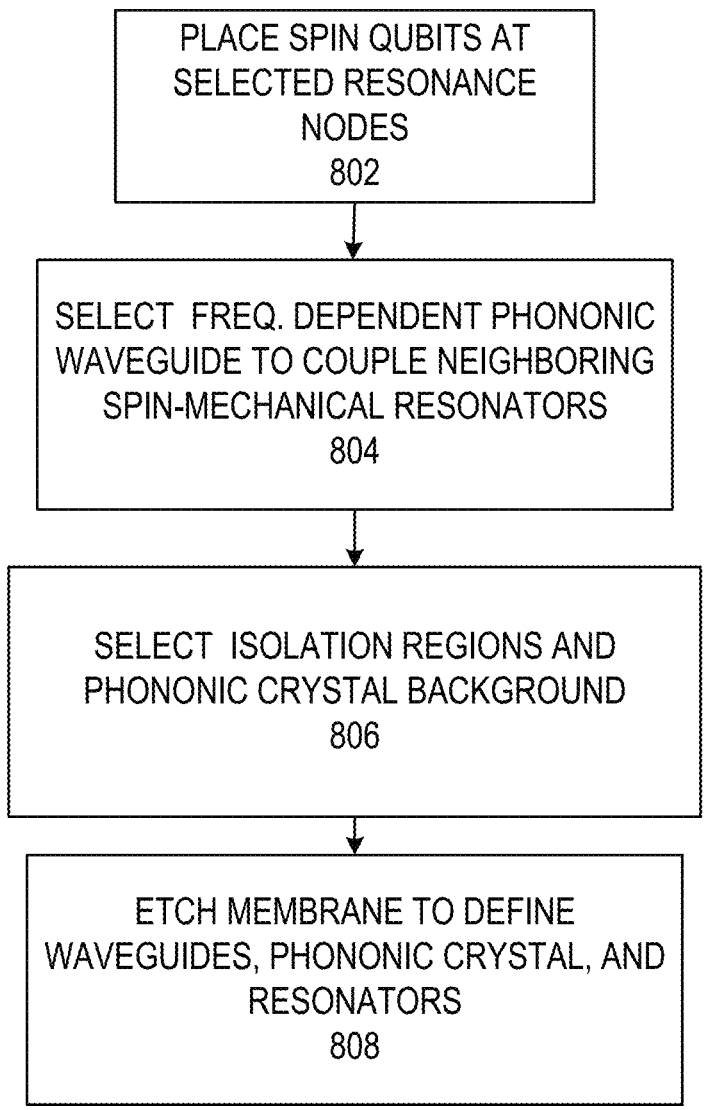
FIG. 8 illustrates a method of fabricating a quantum computing substrate having multiple qubits connected by acoustic waveguides.

FIG. 8 illustrates a representative method 800 of fabrication of structures such as those discussed above. At 802, spin qubits are situated at locations corresponding to resonance nodes. At 804, frequency dependent phononic waveguides are selected to provide directional coupling to adjacent spin qubits. At 806, isolation regions (keepouts) and a phononic crystal background are selected. At 808, a diamond membrane is etched to form the waveguide and resonators.

Figure 9A:
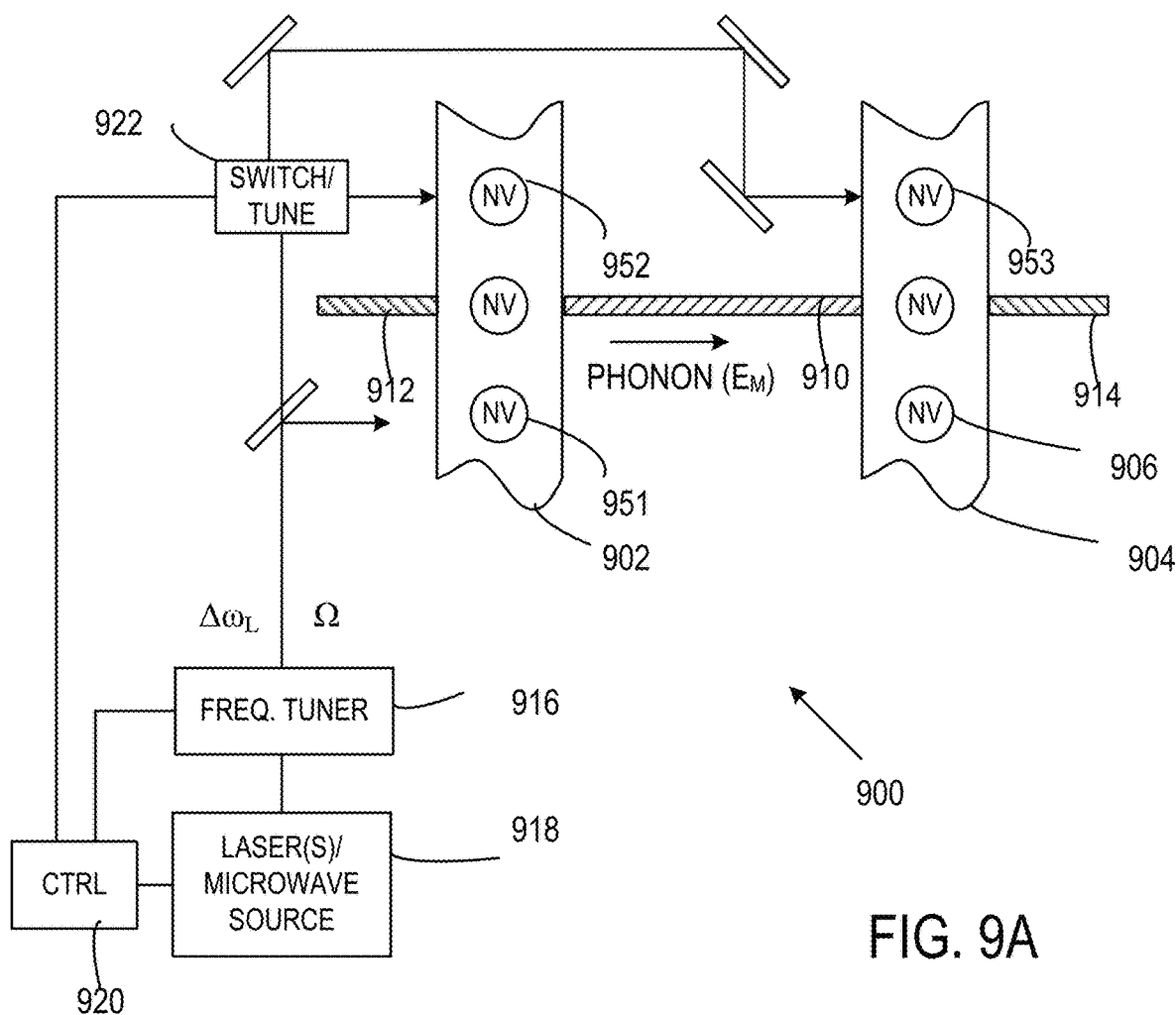
FIG. 9A illustrates quantum computing using acoustically coupled SMRs.

FIG. 9A illustrates a quantum system 900 that permits coupling of spins on SMRs. As shown, SMRs 902, 904 include pluralities of spin centers (such as NV centers) and are coupled to each other via an acoustic waveguide 910 that permits coupling at an acoustic frequency $\omega_m$, wherein $\omega_m$ is a resonance frequency of both the SMRs 902, 904. Acoustic waveguides 912, 914 are configured to permit coupling at a different acoustic frequency to additional SMRs. Such coupling frequencies are resonant frequencies of the SMRs 902, 904.

A laser (or several lasers) 918 or other radiation source or sources couple an output optical beam at two frequencies to a frequency tuner 916 to provide an optical beam associated with a difference frequency that can be selected by a controller 920 to produce a desired transition. In some cases, the frequency tuner 916 is an acousto-optic or electro-optic modulator that frequency shifts a portion of the output optical beam (and provides on/off switching and attenuation, as needed). The frequency shifted optical beam can be at a higher or lower frequency than the output beam, or can be unshifted. In some cases, the laser output frequency is tuned directly by, for example, varying a current provided to a diode laser or adjusting an optical cavity length. One or more additional frequency tuners such a frequency tuner 922 can be provided to frequency shift a previously shifted or unshifted optical beam as needed. For convenience, optical components that distribute beams are illustrated as mirrors, but either bulk or waveguide optics can be used, such as fiber optic beam splitters, combiners, optical fiber waveguides, and waveguide modulators. In other examples, microwave signal generators are used to provide suitable radiation, typically at frequencies less than 100 GHz, and optical difference frequencies need not be used. However, optical beams can provide selectivity of which spin qubits are used for any particular transfer. This can be more difficult at microwave frequencies due to the much longer wavelengths.

Transitions on different SMRs use a coupling acoustic waveguide. For example, the NV center 951 can be irradiated as described above to produce a phonon of energy $E_M$ that is coupled by the acoustic waveguide 910 to the SMR 904. The phonon energy is selected so that the phonon cannot be propagated by the waveguide 912. At the SMR 904, an NV center 953 is irradiated with a difference frequency so that a transition is produced in combination with the phonon produced at NV center 951. Intra-resonator transitions that couple, for example, NV centers 951, 952 can use a different acoustic frequency that does not propagate on the waveguides 910, 912.

Figure 9B:
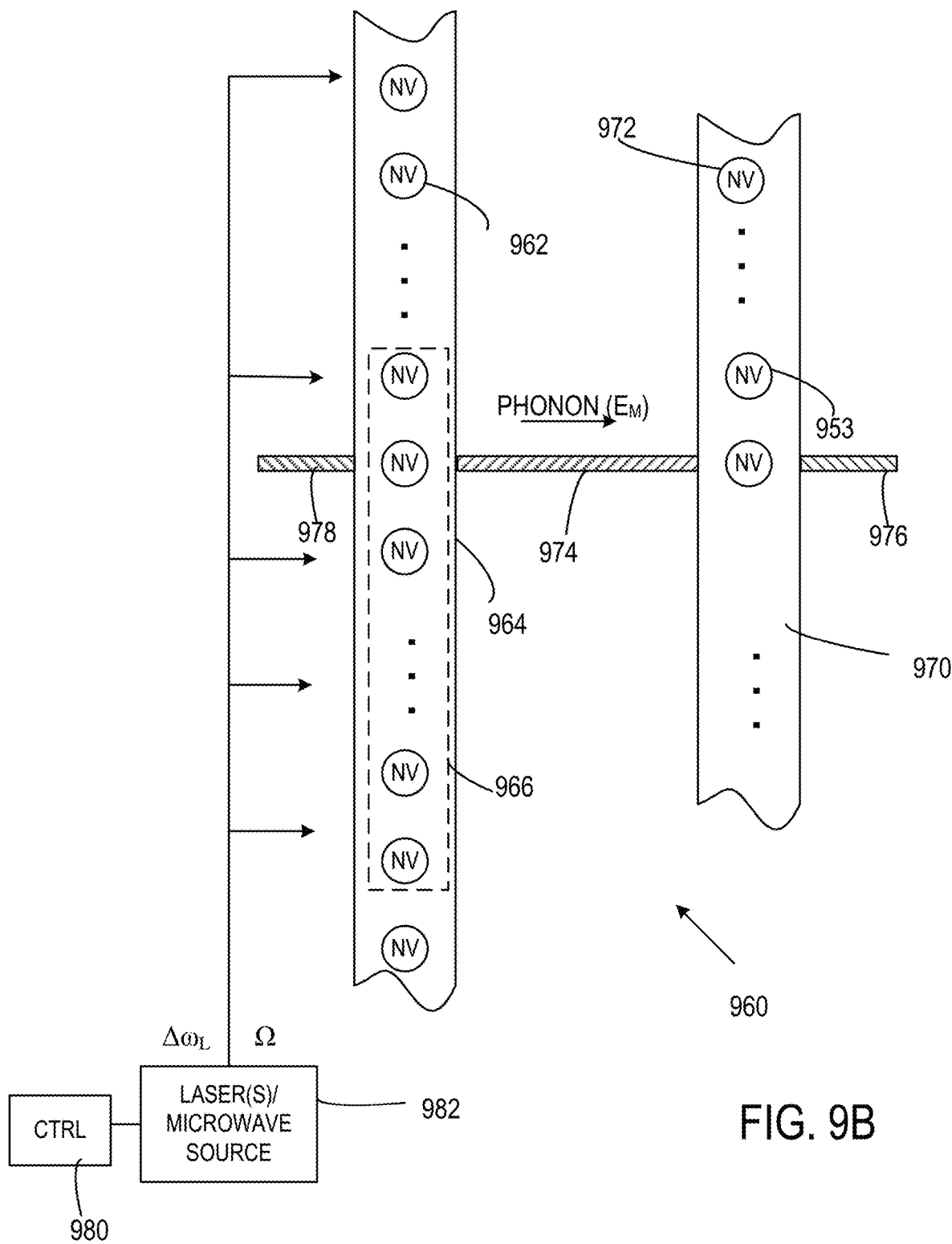
FIG. 9B illustrates thermally robust quantum computing using acoustically coupled SMRs.

FIG. 9B is a schematic illustrating a system 960 that provides thermally robust state transfer. As shown, a state from spin qubit 962 on an SMR 964 is to be transferred to a spin qubit 972 on an SMR 970. The SMRs 964, 970 are acoustically coupled with an acoustic waveguide 974 and are coupled to additional SMRs (not shown) with acoustic waveguides 976, 978 that provide coupling at other acoustic frequencies.

As instructed with a control system 980, a tunable or tuned source 982 provides irradiation at a suitable difference frequency to the spin qubit 962 and an ensemble 966 of spin qubits on the SMR 964. The ensemble 966 can be arbitrarily selected from the spin qubits of the SMR 964, but a large number of spin qubits can provide superior results. After this initialization, state transfer proceeds as discussed above.

Using a spin ensemble instead of a single spin permits transfers that are robust against phonon occupation in the resonator modes and the waveguide modes and can tolerate variations in coupling parameters. The Hamiltonian for spin coupling between spins $S_1$ and $S_2$ can be expressed as:

$$H_1 = hg\hat{b}^+(\hat{a}_1 + \hat{a}_2) + h[G_1(t)\hat{S}_1\hat{a}_1^+ G_2(t)\hat{S}_2\hat{a}_2^+] + h.c.$$

wherein $G_1$, $G_2$ are proportional to applied field amplitudes and duration of field application, and h.c. refers to a Hermitian conjugate. Applying this Hamiltonian, it can be shown that for $$G_1 = G_2 = \sqrt{\frac{2}{4n^2 - 1}}\, g,$$

wherein n is an integer:

$$S_1(\pi/G_1) = S_2(t=0)$$

Figure 10:
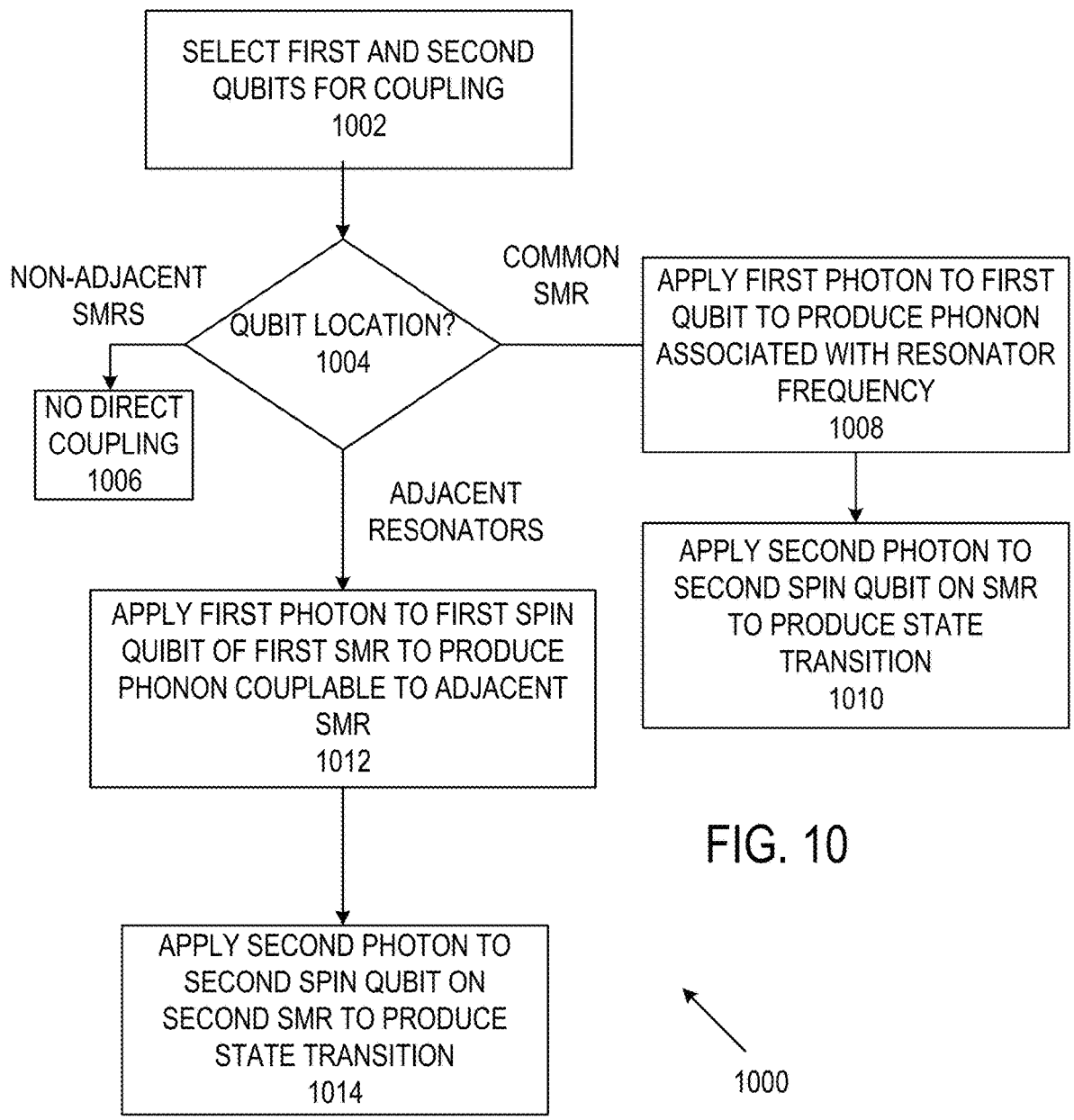
FIG. 10 illustrates a method of producing qubit state transitions.

A representative method of producing state transitions is shown in FIG. 10. At 1002, first and second qubits associated with the transition are selected. At 1004, the first and second qubits are identified as being on the same SMR, on adjacent SMRs, or on non-adjacent SMRs. If non-adjacent, there is no direct coupling as shown at 1006, and multiple adjacent couplings must be used. If on the same SMR, at 1008, a first photon is applied to the first qubit to produce a phonon at a mechanical resonance frequency, and a second photon it applied to the second qubit at a frequency sufficient to produce a transition in combination with the phonon produced by the first qubit. If the first and second qubits are on adjacent resonators, at 1012, a first photon is applied to the first qubit to produce a phonon for coupling via a frequency-dependent waveguide to the resonator associated with the second qubit. At 1014, the second qubit is exposed to a second photon so that the second qubit transitions in response to the combination of the second photon and the phonon.

The above describes only selected transitions and uses the simplified energy level diagram of FIGS. 1A-1C. Other transitions can be similarly produced, and details of the quantum states are omitted for clarity of description.

Figure 11:
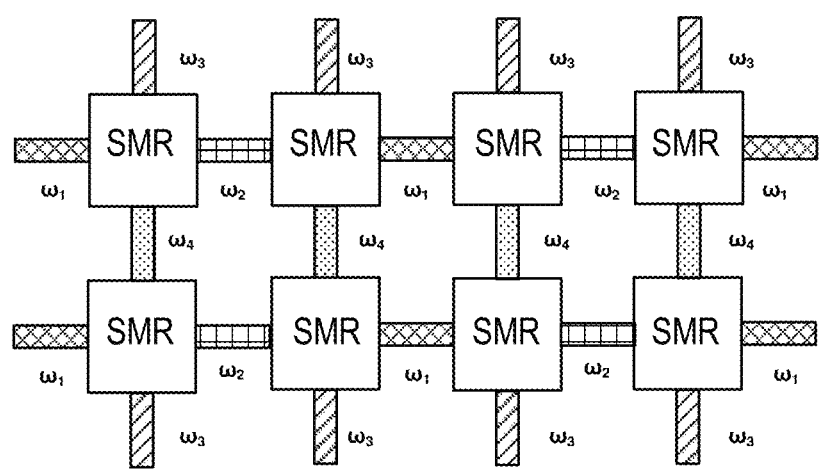
FIG. 11 illustrates a two dimensional arrangement of SMRs.

FIG. 11 illustrates a two dimensional architecture in which each SMR communicates with other SMRs at four different frequencies, and within the SMR at an additional frequency.

Figure 12:
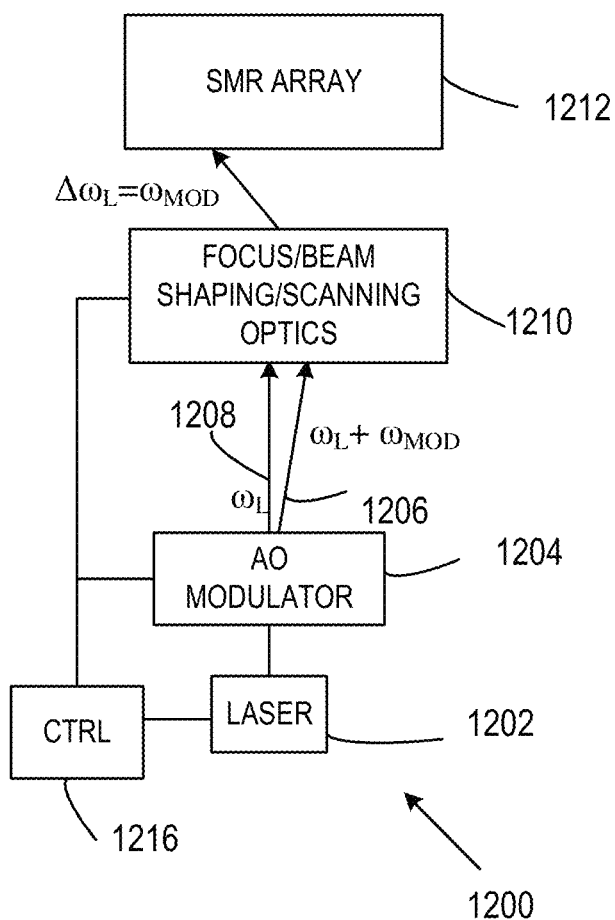
FIG. 12 illustrates an SMR system that includes an acousto-optic modulator.

With reference to FIG. 12, a representative SMR system 1200 includes a laser 1202 situated to direct an optical beam to an acousto-optic modulator 1204 that produces a diffracted output beam 1206 at an angular frequency $\omega_L + \omega_{Bragg}$ and a undiffracted output beam 1208 at an angular frequency $\omega_L$. These beams are directed to focusing/scanning/shaping optics 1210 for delivery to one or more SMRs of an SMR array 1212. Beam scanning, modulation, frequency shifting and selection of SMRs or SMR ensembles to be irradiated are determined by a controller 1216. In other examples, beams from different lasers or other sources are selected to have a preferred frequency difference, or a single beam is divided into portions, one or both of which can be frequency shifted, and these beams recombined.

Figure 13A:
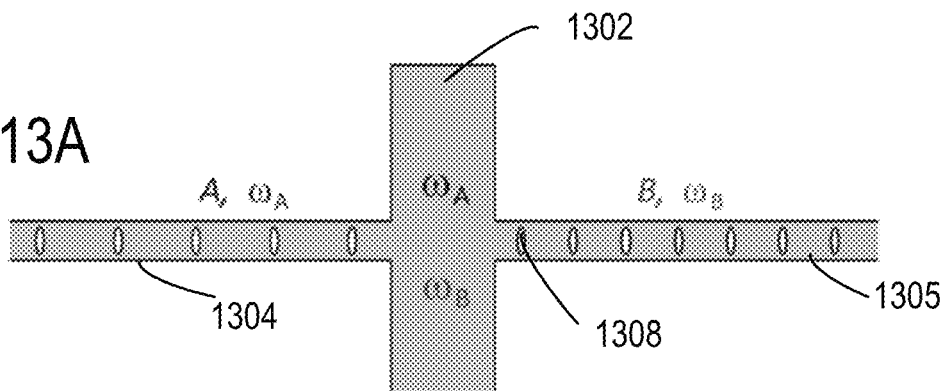
FIG. 13A illustrates a representative SMR.
Figure 13B:
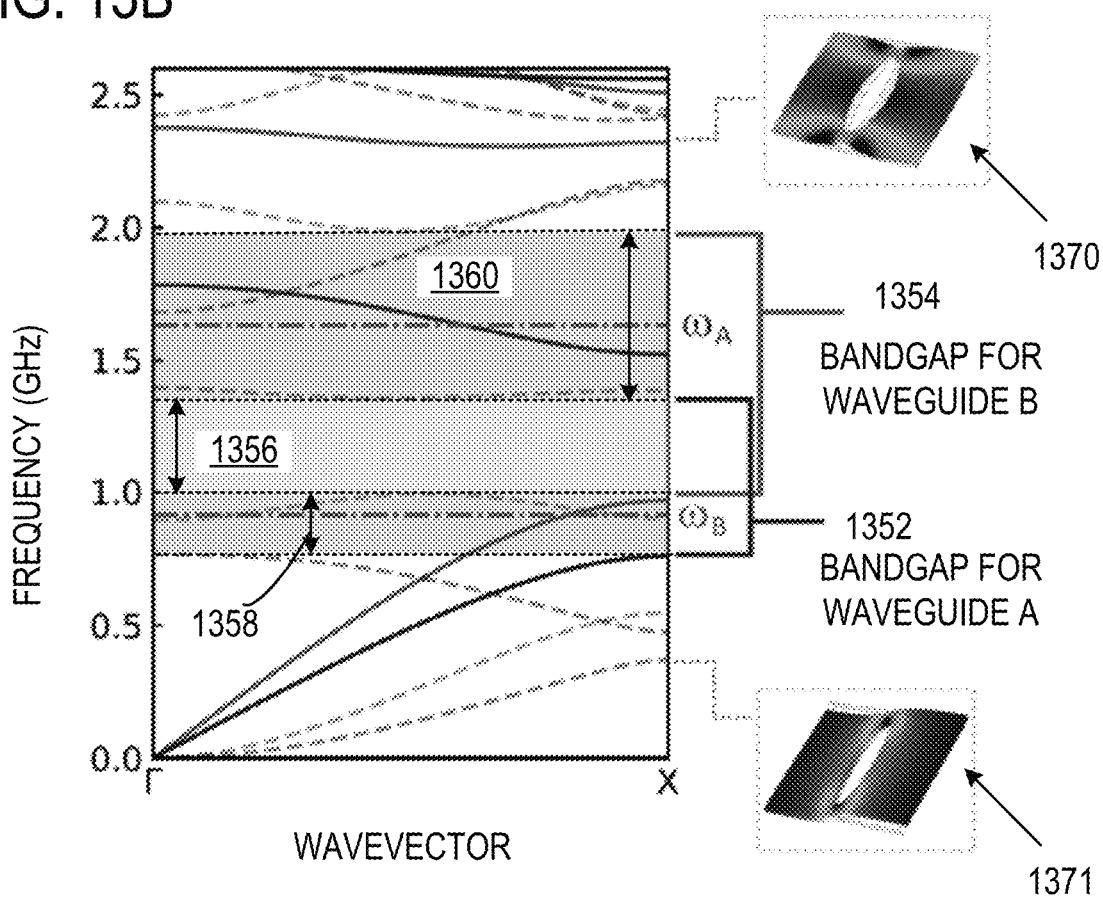
FIG. 13B illustrates bandgaps associated with the phononic waveguides illustrated in FIG. 13A.

FIG. 13A illustrates a representative mechanical resonator 1302 coupled to two phononic waveguides 1304, 1305 (also noted as waveguides A, B) having a width of 3 μm and respective periods of 6 μm and 4 μm. Elliptical holes such as elliptical hole 1308 have minor (major) axes of 0.6 (2.2) μm. FIG. 13B illustrates phononic band structures of the phononic waveguides 1304, 1305. The phononic waveguides 1304, 1305 have respective bandgaps 1352, 1354 that define an overlapping portion 1356 and respective non-overlapping portions 1358, 1360. Solid (dashed) lines indicate modes with displacement patterns that are symmetric (antisymmetric) about a plane that bisects and is normal to both the waveguides and the resonators. Dot-dashed lines indicate frequencies $\omega_A$, $\omega_B$ of the resonator modes used to couple the respective waveguide modes. In this example, a resonator mode at 1.3258 GHz (a fourth order compressional mode) is situated in the overlapping portion 1356 and can be used for intra-resonator coupling. Other modes in the overlapping portion 1356 can be used as well. For convenience, representation of two modes 1371, 1372 are illustrated.

Figure 14A:
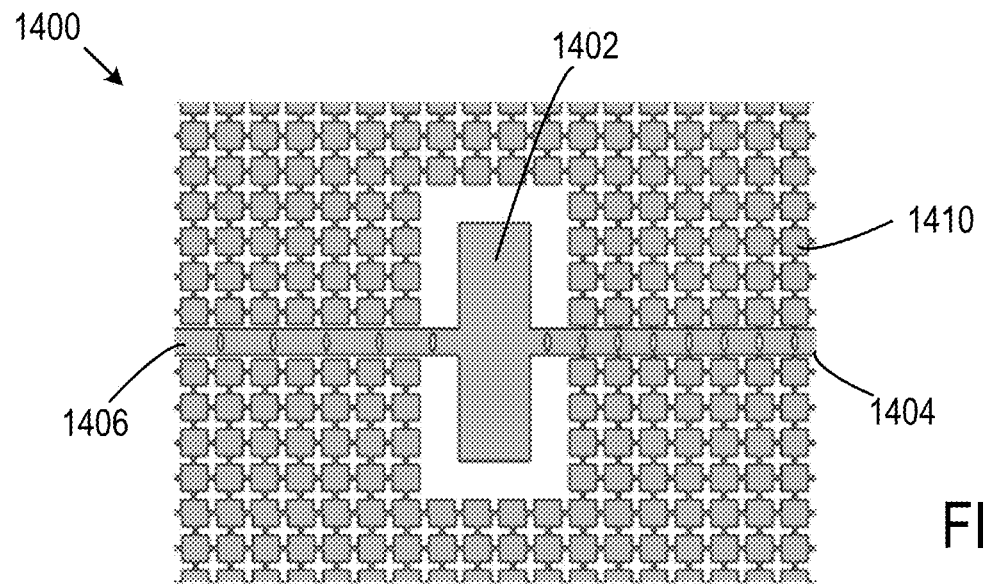
FIG. 14 illustrates a representative SMR such as shown in FIG. 13A that is acoustically isolated with a phononic crystal lattice.
FIG. 14B illustrates a bandgap associated with a phononic lattice such as illustrated in FIG. 14A.
Figure 14B:
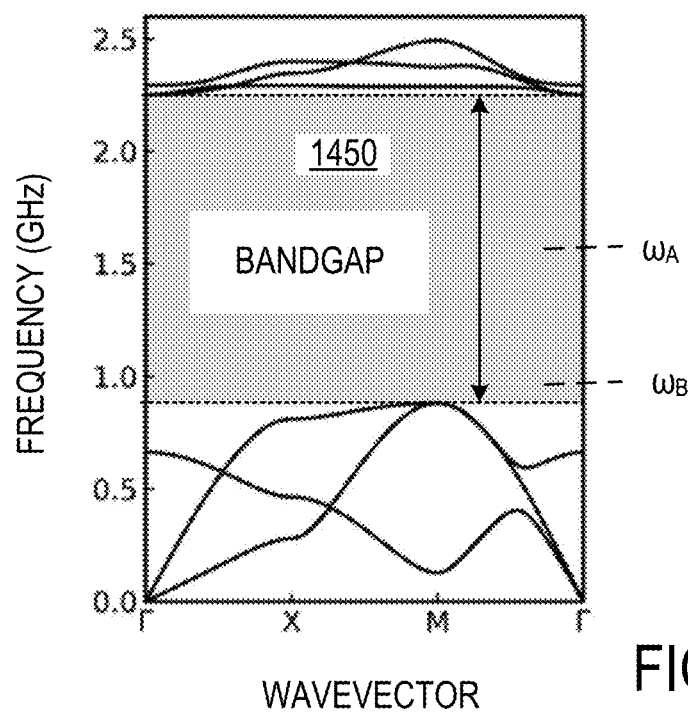

FIG. 14A illustrates a representative spin mechanical resonator 1402 coupled to phononic waveguides 1404, 1406 such as illustrated in FIG. 13A. The phononic waveguides are situated in a representative phononic crystal lattice 1410. In this examples, the phononic crystal lattice 1410 consists of 3 μm square blocks spaced with a 4 μm period. Bridges connecting the squares are 1 μm long and of 0.4 μm wide. FIG. 14B illustrates the band structure of the phononic crystal lattice 1410. Representative waveguide frequencies $\omega_A$, $\omega_B$ used for communication among spin mechanical resonators are in a bandgap 1450 that extends from 0.85 GHz to 2.25 GHz. Characteristics of selected symmetric mechanical modes are shown as well. In the example of FIG. 14A, the phononic waveguide 1404 and the phononic crystal lattice 1410 have the same period and are coupled together. By contrast, the phononic waveguide 1406 is spaced apart and serves further to isolate phononic waveguide 1404.

Figure 15A:
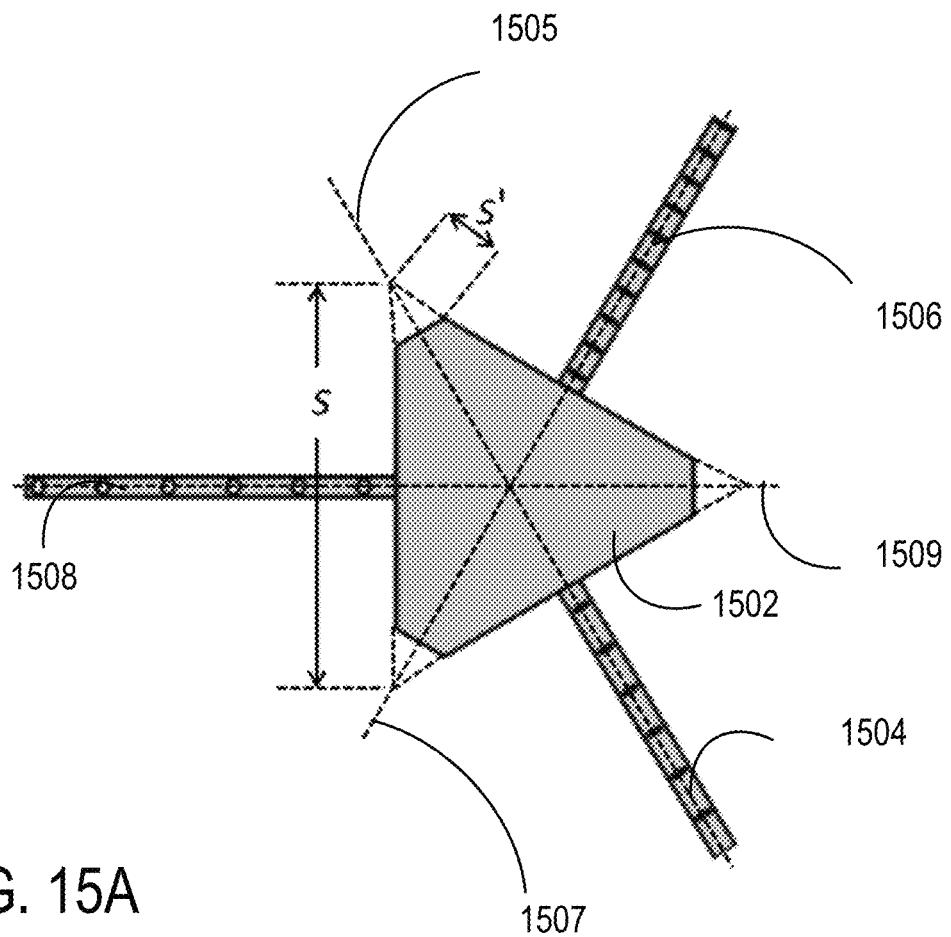
FIGS. 15A-15C illustrate an alternative arrangement of SMRs.

SMRs can of different types and different spatial arrangements can be used as well. Referring to FIG. 15A, a triangular acoustic resonator 1502 is acoustically coupled to acoustic waveguides 1504, 1506, 1508 that extend along respective axes 1505, 1507, 1509 that are orthogonal to sides of the acoustic resonator 1502 and that intersect at midpoints of triangle sides. In addition, each corner of the acoustic resonator 1502 is truncated, wherein a length of a triangular side without truncation is S and a length of the truncated portion is S'. In the example of FIG. 15A, a shape of the acoustic resonator 1502 corresponds to an equilateral triangle with corners removed. The acoustic waveguides 1504, 1506, 1508 are configured to provide coupling at acoustic frequencies $\omega_1$, $\omega_2$, $\omega_3$, respectively. As discussed above, each of these waveguides is configured to isolate the acoustic resonator 1502 at acoustic frequencies associated with the other acoustic waveguides.

Figure 15B:
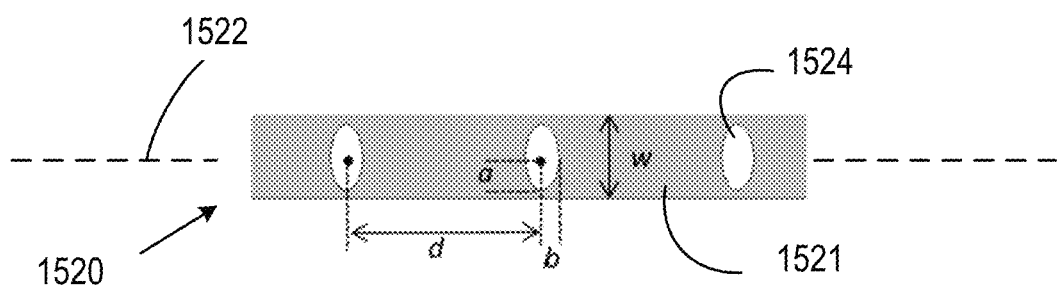

Referring to FIG. 15B, a representative acoustic waveguide 1520 such as illustrated in FIG. 15A includes a membrane section 1521 of width w that extends along an axis 1522 and includes periodically spaced holes in the membrane or thinned membrane areas 1524. As shown, the spacing period is d and the areas 1524 are elliptical with semi-major axis a and semi-minor axis b. A substrate on which the acoustic waveguide is defined is not shown. Dimensions are selected to provide suitable communication and isolation frequencies.

Figure 15C:
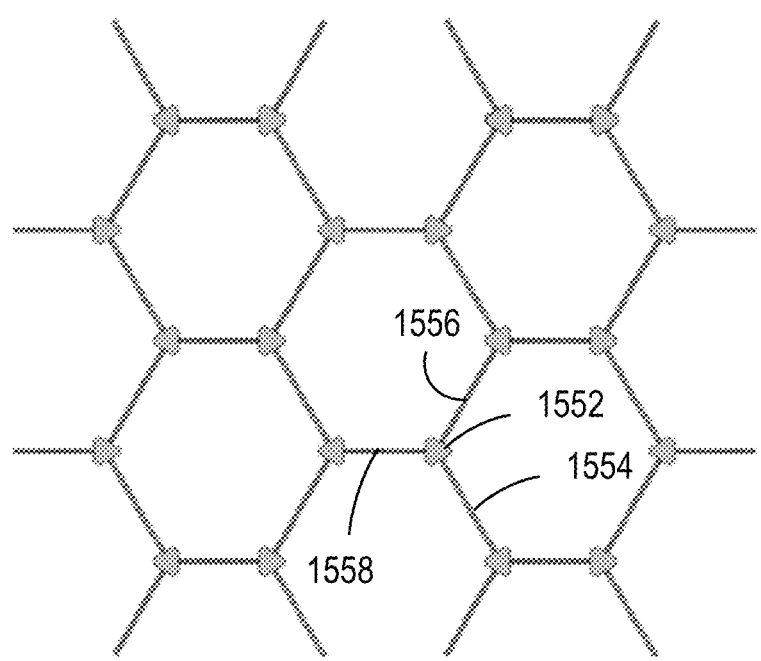

Referring to FIG. 15C, a lattice 1550 includes a plurality of interconnected acoustic resonators such as an acoustic resonator 1552 that is coupled to adjacent resonators with waveguides 1554, 1556, 1558. In this example, the waveguides 1554, 1556 have a common length and the waveguide 1558 is longer or shorter. As above, the waveguides are selected to provide frequency dependent coupling.

Referring to FIGS. 16A-16C, a representative quantum circuit 1600 includes an arrangement 1601 of triangular acoustic resonators surrounding by a phononic crystal that includes portions 1602, 1603 and 1606, 1607. A representative acoustic resonator 1612 is coupled to acoustic waveguides 1610, 1614 (a third is not shown); the acoustic waveguide 1610 is coupled to an extension 1607A of the phononic crystal portion 1607 as shown in FIG. 16B. A period of the acoustic waveguide 1610 is that same as a period of the portion 1607 along a length of the acoustic waveguide 1610 (i.e., in a X-direction) so that acoustic waveguide 1610 is connected to the extension 1607A. Similarly, an acoustic waveguide 1620 that is coupled to an acoustic resonator 1619 is connected to the portion 1603 as both have a common period in a Y-direction. Such connection of acoustic waveguides and phononic lattices tends to enhance acoustic isolation.

In view of the many possible embodiments to which the principles of the disclosure may be applied, it should be recognized that the illustrated embodiments are only preferred examples and should not be taken as limiting in scope.

We claim:

1. A quantum circuit, comprising:
   at least a first spin qubit situated on a first mechanical resonator; and
   a first acoustic waveguide coupled to the first mechanical resonator in a first acoustic frequency range.

2. The quantum circuit of claim 1, further comprising:
   a second acoustic waveguide coupled to the first mechanical resonator in a second frequency range that is different from the first frequency range.

3. The quantum circuit of claim 2, wherein the first mechanical resonator, the first acoustic waveguide, and the second acoustic waveguide are defined in a diamond membrane.

4. The quantum circuit of claim 3, wherein the first mechanical resonator is defined by a rectangular portion of the diamond membrane, and the first frequency range and the second frequency range are defined by a first set of holes in the first acoustic waveguide and a second set of holes in the second acoustic waveguide, wherein a first period associated with the first set of holes and a second period associated with the second set of holes are different.

5. The quantum circuit of claim 4, wherein the first acoustic waveguide is coupled to the first mechanical resonator at a first side of a central portion of the first mechanical resonator, and the second acoustic waveguide is coupled to the first mechanical resonator at a second side of the central portion of the first mechanical resonator.

6. The quantum circuit of claim 5, wherein the first acoustic waveguide and the second acoustic waveguide extend along a common axis that is perpendicular to the first side and second side of the first mechanical resonator, and the first set of holes and the second set of holes are periodic along the common axis.

7. The quantum circuit of claim 6, wherein the first acoustic waveguide and the second acoustic waveguide define a first bandgap and a second bandgap, respectively, wherein the first frequency range and the second frequency range correspond to non-overlapping portions of the first bandgap and the second bandgap.

8. The quantum circuit of claim 7, wherein the diamond membrane has a thickness between 100 nm and 1 μm.

9. The quantum circuit of claim 8, wherein at least the first spin qubit is situated at an acoustic node of the first mechanical resonator.

10. The quantum circuit of claim 6, further comprising:
a second mechanical resonator coupled to the first mechanical resonator by the first acoustic waveguide in the first frequency range at a first side of a central portion of the second mechanical resonator; and
at least a second spin qubit situated on the second mechanical resonator, wherein the first acoustic waveguide and at least the first spin qubit are coupled to the second mechanical resonator and the second spin qubit in the first acoustic frequency range.

11. The quantum circuit of claim 10, wherein the second mechanical resonator is defined by a rectangular portion of the diamond membrane.

12. The quantum circuit of claim 11, wherein the holes of at least the first set of holes or the second set of holes are elliptical having minor axes extending along the common axis of the first acoustic waveguide and the second acoustic waveguide.

13. The quantum circuit of claim 2, further comprising:
a second mechanical resonator coupled to the first mechanical resonator by the first acoustic waveguide; and
at least a second spin qubit situated on the second mechanical resonator.

14. The quantum circuit of claim 13, wherein the first and second spin qubits are defined by respective nitrogen-vacancy (NV), germanium-vacancy (GeV), or silicon-vacancy (SiV) centers in a diamond membrane, and the first and second mechanical resonators are defined by respective portions of the diamond membrane.

15. The quantum circuit of claim 13, wherein the first acoustic waveguide is defined in a portion of a diamond membrane and includes a periodic variation in acoustic impedance so as to attenuate acoustic propagation between the first and second mechanical resonators at an acoustic frequency associated with a period of the periodic variation.

16. The quantum circuit of claim 13, further comprising:
a third mechanical resonator coupled to the first mechanical resonator by the second acoustic waveguide; and
at least a third spin qubit situated on the third mechanical resonator.

17. The quantum circuit of claim 13, wherein at least one of the first acoustic waveguide and the second acoustic waveguide includes a plurality of periodically situated thinned areas or apertures that define an associated frequency range.

18. The quantum circuit of claim 17, wherein the first acoustic waveguide and the second acoustic waveguide include periodically situated thinned areas or apertures having a first period and a second period, respectively, and that define respective bandgaps that are partially overlapping and the first acoustic frequency range and the second acoustic frequency range are associated with nonoverlapping portions of the respective bandgaps.

19. A quantum circuit, comprising:
a plurality of spin-mechanical resonators (SMRs);
a plurality of acoustic waveguides coupled to the SMRs so that each SMR is coupled to a first other SMR in a first frequency band and a second other SMR in a second frequency band that is different than the first frequency band; and
a phononic crystal situated about the SMRs, wherein a bandgap of the phononic crystal includes frequencies of the first frequency band and the second frequency band.

20. The quantum circuit of claim 19, wherein the SMRs are arranged in a linear array or a two dimensional array.

21. The quantum circuit of claim 20, wherein the SMRs are arranged in a two dimensional array, and SMRs of a first row are alternately coupled at first and second different frequencies by associated acoustic waveguides of the plurality of acoustic waveguides to adjacent SMRs of the first row, adjacent SMRs of a second row that is adjacent the first row are alternately coupled at the first and second different frequencies by associated acoustic waveguides of the plurality of acoustic waveguides to adjacent SMRs of the second row, and column-wise adjacent SMRs of the first row and the second row are coupled by associated acoustic waveguides at a third frequency that is different from the first frequency and the second frequency.

22. A method, comprising:
selecting a first spin qubit situated on first spin-mechanical resonator (SMR) and a second spin qubit situated on a second SMR;
providing acoustic coupling between the first SMR and the second SMR in a first acoustic frequency range;
producing a phonon at a resonance frequency of the mechanical resonator of the second SMR, wherein the phonon frequency is in the first acoustic frequency range; and
coupling the phonon to the second SMR so that a quantum state of the second spin qubit of the second SMR changes based on a quantum state of the first spin qubit of the first SMR.

23. The method of claim 22, wherein the phonon is produced at a difference frequency associated with frequency components of an optical beam.

24. The method of claim 22, wherein the phonon is produced in response to an applied microwave signal.

25. The method of claim 22, wherein the first SMR and the second SMR are acoustically coupled to a third SMR and a fourth SMR, respectively, in a second acoustic frequency range that is different from the first acoustic frequency range.

26. The method of claim 22, further comprising selecting the first spin qubit of the first SMR and a second spin qubit of the first SMR:
   providing acoustic coupling between the first spin qubit of the first SMR and the second spin qubit of the first SMR in an intra-SMR acoustic frequency range in which the first SMR and the second SMR are uncoupled; and
   coupling an intra-SMR phonon in the intra-SMR frequency range to the second spin qubit of the first SMR so that a quantum state of the second spin qubit of the first SMR changes.

27. The method of claim 22, further comprising:
   acoustically coupling the first spin qubit of the first SMR to an ensemble of spin qubits on the first SMR; and
   wherein the coupling the phonon to the second SMR so that a quantum state of the second spin qubit of the second SMR changes based on a quantum state of the first spin qubit of the first SMR includes transferring a state of the first spin qubit of the first SMR to the second spin qubit of the second SMR in response to the phonon.

* * * * *